United States Patent [19]
Kudoh

[11] Patent Number: 5,331,192
[45] Date of Patent: Jul. 19, 1994

[54] SEMICONDUCTOR DEVICE

[75] Inventor: Hitoshi Kudoh, Kyoto, Japan

[73] Assignee: Matsushita Electric Industrial Co., Ltd., Osaka, Japan

[21] Appl. No.: 937,440

[22] Filed: Aug. 27, 1992

Related U.S. Application Data

[63] Continuation of Ser. No. 708,122, May 29, 1991, abandoned, which is a continuation of Ser. No. 539,029, Jun. 15, 1990, abandoned.

[30] Foreign Application Priority Data

Jun. 15, 1989 [JP] Japan .................. 1-153425

[51] Int. Cl.$^5$ ........................... H01L 27/02
[52] U.S. Cl. .................. 257/368; 257/213; 257/288; 257/401
[58] Field of Search ............ 357/23.4, 23.14, 23.4; 257/368, 288, 213, 401

[56] References Cited

U.S. PATENT DOCUMENTS

| | | | |
|---|---|---|---|
| 3,803,461 | 4/1974 | Beneking | 357/23.14 |
| 3,829,883 | 8/1974 | Bate | 257/288 |
| 4,803,533 | 2/1989 | Chang et al. | 357/23.4 |
| 4,816,892 | 3/1989 | Temple | 357/23.4 |
| 4,821,095 | 4/1989 | Temple . | |
| 4,845,536 | 7/1989 | Heinecke et al. | 257/401 |
| 4,924,277 | 5/1990 | Yamane et al. | 357/23.4 |
| 4,928,156 | 5/1990 | Alvis et al. | 357/23.4 |
| 4,931,408 | 6/1990 | Hshieh | 357/23.4 |

FOREIGN PATENT DOCUMENTS

| | | | |
|---|---|---|---|
| 60-92667 | 5/1985 | Japan | 357/23.14 |
| 61-222260 | 10/1986 | Japan | 357/23.4 |
| 62-163372 | 7/1987 | Japan | 357/23.4 |
| 142177 | 2/1989 | Japan | 357/23.4 |

Primary Examiner—William L. Sikes
Assistant Examiner—Hung Xuan Dang
Attorney, Agent, or Firm—Ratner & Prestia

[57] ABSTRACT

A semiconductor device includes plural transistors in which the transistors themselves share a gate and a channel region and posses three or more source and drain regions. In such a configuration, a drain current is determined by the voltage application condition (potential difference of all source and drain regions). Therefore, assuming one of the three source and drain regions to be a control terminal (disturbance terminal) instability or drift of the transistor operation may be intentionally produced by applying proper voltages to each of the three source and drain regions.

12 Claims, 18 Drawing Sheets

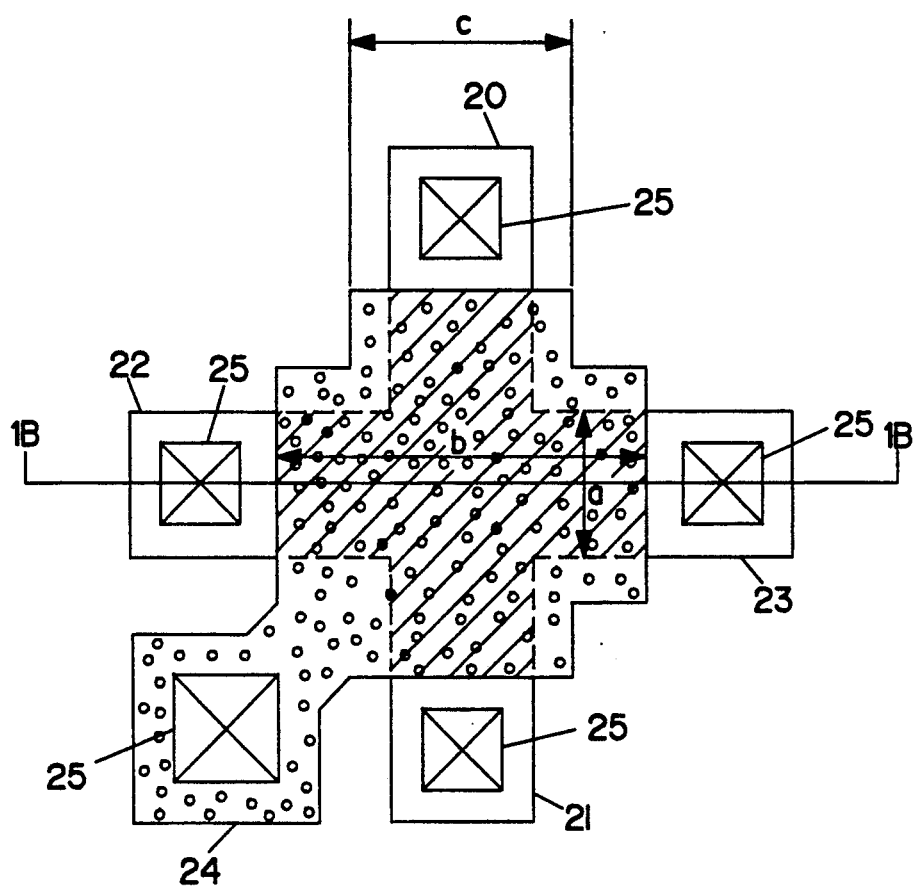
FIG. IA

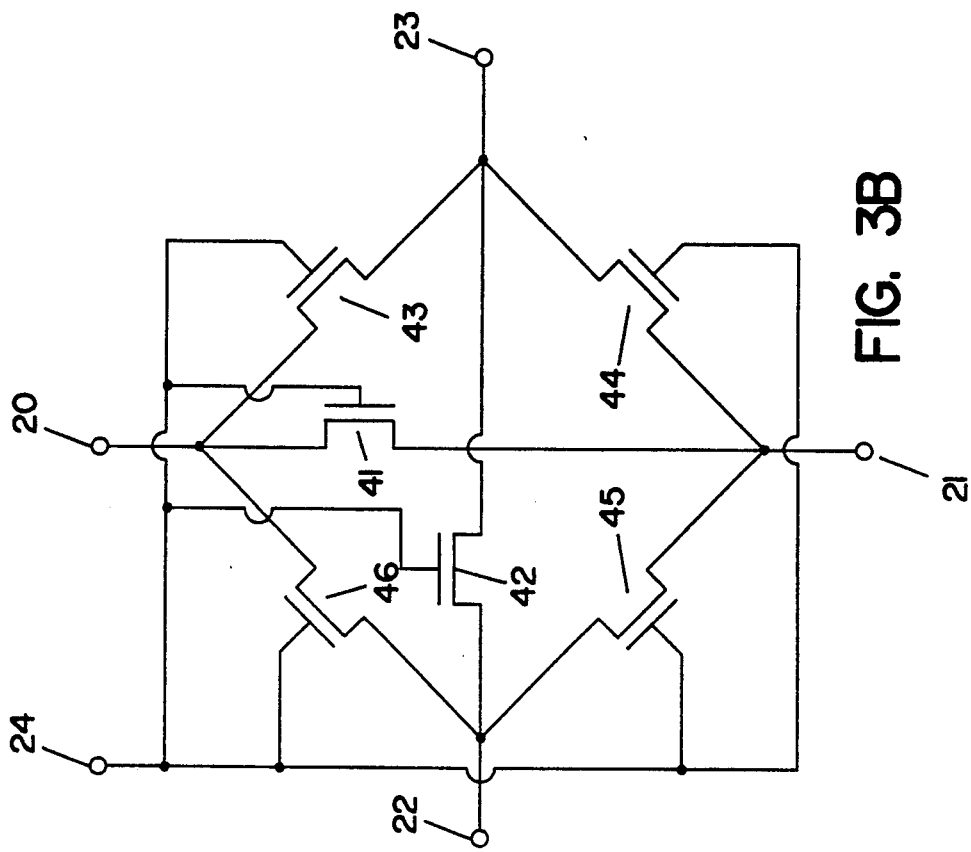
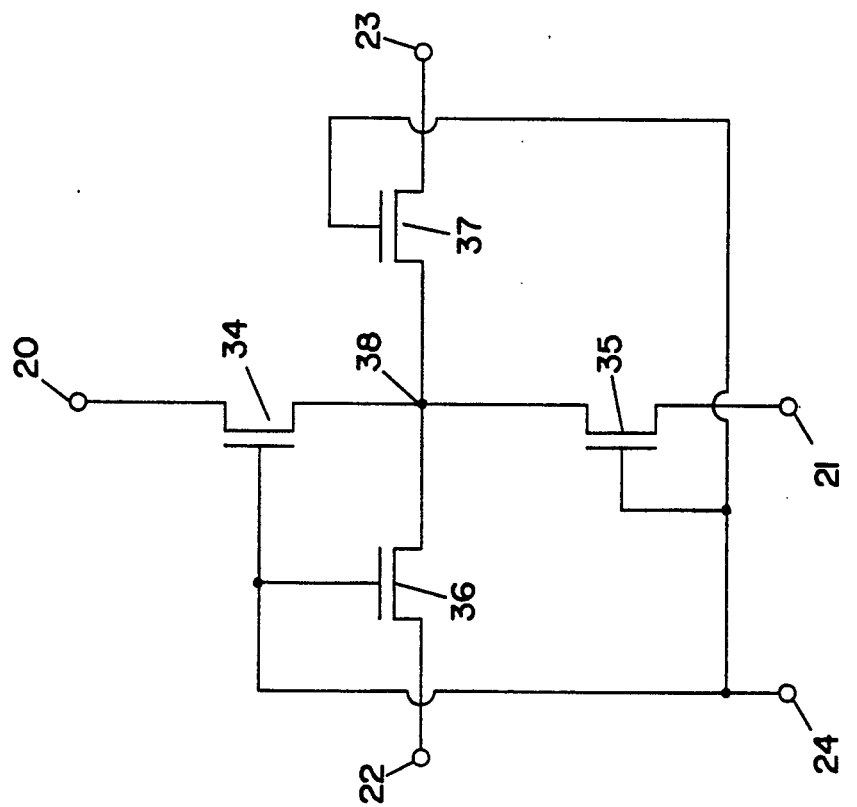
FIG. 3B
FIG. 3A

SEMICONDUCTOR DEVICE

This is a continuation of application Ser. No. 07/708,122 filed May 29, 1991, now abandoned, which is a continuation of application Ser. No. 07/539,029, filed Jun. 15, 1990 now abandoned.

BACKGROUND OF THE INVENTION

The present invention relates to a semiconductor device.

In semiconductor devices, especially integrated circuit devices using MOS transistors, there is a mounting demand for smaller size and higher speed as the system is being enhanced in function and enlarged in capacity more and more. As a result, a device having a design rule of 1 $\mu$m or less has been realized.

The MOS transistor used in such devices is composed of one source, one drain and one gate. As the device size is shrunk, in order to maintain the device characteristics, the source and drain in the device are composed by forming a diffusion layer called LDD, or the gate electrode is made of refractory metals or refractory metal silicide. However, even if the device is further shrunk, the basic structure of the MOS transistor is unchanged, comprising one source, one drain and one gate.

A plan view and a sectional view of a conventional MOS transistor are shown in FIGS. 17A and 17B.

A field oxide film 2 for separating devices is formed on a substrate 1. A device is formed in a region enclosed by the field oxide film 2. The device is composed by forming a source 5a and a drain 5b (positions of 5a and 5b may be interchanged) by introducing impurities of the reverse conductive type of the substrate 1 into the substrate 1. In the region between the source 5a and the drain 5b, a gate oxide film 3 is formed on the substrate 1. A gate electrode 4 is formed on the gate oxide film 3. The structure of only one device is shown here, but in an actual integrated circuit device, a plurality of such devices are disposed, and the desired devices are connected with metal wiring to make up an intended circuit. Meanwhile, an insulation film 6 is formed on the entire surface of the device so as to avoid malfunction due to electric contact by the metal wiring mutually connecting the elements. The metal wiring connecting the devices must contact with the source 5a, drain 5b, or the gate electrode 4. Therefore, specific regions of insulation film 6 are removed by etching, and contact holes 7 for connecting the metal wirings are formed.

There are, however, functions that cannot be realized or hardly realized by the aforesaid construction of the conventional devices, and the development of devices having such functions is being awaited.

One of such desired functions is that, when a specific device is fabricated, a nerve circuit known as neuron should be easily assembled at a similar distribution of device characteristics of other devices manufactured in the same conditions.

In other words, what must be taken into consideration when designing a circuit having a certain function is to design a circuit capable of realizing a high yield in the aspect of fabrication of circuit while operating stably as the designed circuit. That is, it is required to design so as to optimize the circuit operation and to have a sufficient allowance in the circuit operation. As the method for this purpose, for example, it is known to design a basic circuit for optimizing the circuit operation, manufacture the designed device, measure the characteristic of the device, and estimate the characteristic of the intended circuit on the basis of the measured characteristic. In another method, it is known to stimulate the operation of a desired circuit by a computer by using the preliminary extracted parameters of device fabrication and device characteristic.

In both methods, nevertheless, the connecting manners of the transistors, resistors, capacitors and other components of the circuit are determined together with the input and output method and entire circuit construction, and still more the characteristics of the individual elements such as transistors, resistors and capacitors must be predetermined.

The circuit composition may be relatively easily determined by the logic design. On the other hand, the characteristics of individual elements differ depending on the manufacturing conditions, manufacturing equipment, or difference in substrates among manufacturing lots even in identical manufacturing conditions. Accordingly, if a multiplicity of identical devices should be manufactured, discrepancies of characteristics occur among the devices. Therefore, if the allowance of operation of the device characteristics on the whole is discussed by making routine measurement of device characteristics, circuits of high reliability will not be expected. To the contrary, if all device characteristics are carefully examined by either fabricating basic circuits or simulating them, it takes enormous time and cost, and it is not practicable.

Incidentally, the nerve circuit exhibits its effect when it is used to bring the computer more closely to the human thinking manner.

A nerve circuit is composed as a matrix by organically coupling the individual nerve cells. To form such circuit composition by using transistors, the individual prices are intricately combined and the wiring and other structures are very complicated, and it is hard to realize as a circuit.

In order to solve the above problems, the invention intends to present a semiconductor device capable of designing the circuit easily which was difficult in the conventional semiconductor device, and also capable of effectively and easily realizing the formation of the nerve circuit by organically coupling transistors.

SUMMARY OF THE INVENTION

The semiconductor device of the present invention possesses a combined structure of several transistors. Hitherto, in the circuit composition, sharing of the gate, or sharing of the drain of a preceding transistor and the source of a succeeding transistor has been known, whereas, in this invention, the element itself possesses plural transistors sharing a channel region. That is, the semiconductor device of the invention has plural transistors compounded in a form of sharing the gate and channel, and possesses three or more sources and drains.

In such an arrangement, not only the drain current is determined depending on the potential difference of the source and drain, but also the individual drain current increases or decreases depending on the condition of voltage applied to all source and drain terminals. In the invention, since there are three or more sources and drains, the drain current increases or decreases depending on the magnitude of the voltage applied to them. Therefore, assuming one of the plurality of source and drain terminals to be a control terminal (disturbance terminal) of the transistor having other sources and drains, instability or drift of the transistor operation may be intentionally produced by applying a proper voltage to the source and drain terminals.

BRIEF DESCRIPTION OF THE DRAWINGS

FIG. 1A is a plan view of a semiconductor device according to a first embodiment of the invention.

DETAILED DESCRIPTION OF THE INVENTION

Figure 1B:
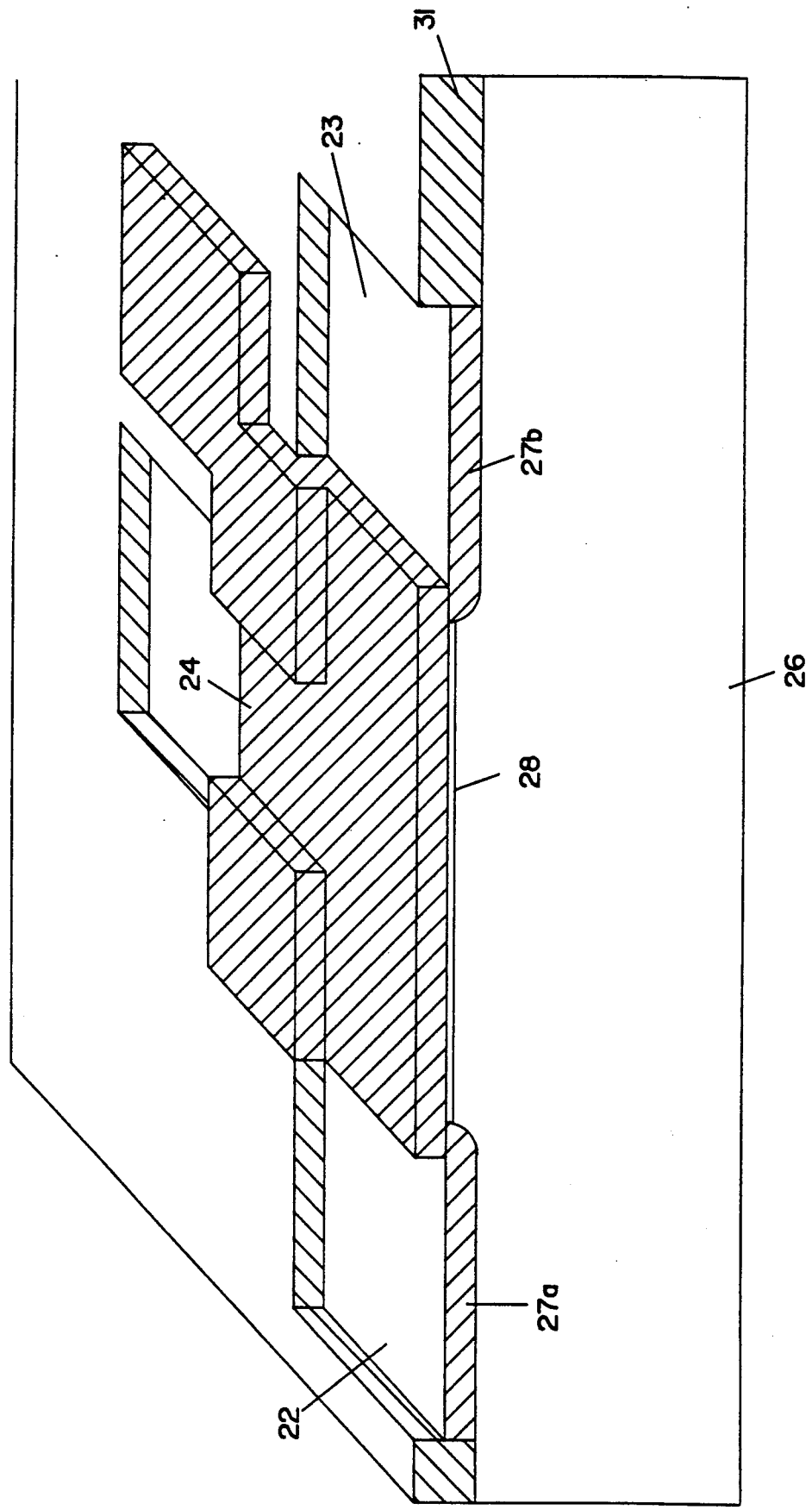
FIG. 1B is a partially cut-away perspective view of 1B—1B of FIG. 1A, FIG. 2A, FIG. 2B are conceptual diagrams for explaining the operation of the semiconductor device in FIGS. 1A, 1B, FIG. 3A, FIG. 3B are equivalent circuit diagrams of the semiconductor device in FIGS. 1A, 1B, FIG. 4A, FIG. 4B are plan view and equivalent circuit diagram for explaining the flow of the current in the semiconductor device in FIGS. 1A, 1B.

Referring now to the drawings, some of the embodiments of the invention are described in detail below.

FIG. 1A is a plan view of a semiconductor device according to a first embodiment of the invention. Diffusion layers are respectively formed of first source 20, a first drain 21, second source 22 and a second drain 23. A common gate 24 is formed in the region between first source 20, first drain 21, second source 22 and second drain 23.

To achieve electric connections with diffusion layers, contact holes 25 are formed on the diffusion layer of first source 20 and first drain 21, and the diffusion layer of second source 22 and second drain 23. Besides, the contact hole 25 of the common gate 24 is disposed in a region not contacting electrically with the other diffusion layers.

The line linking the first source 20 and the first drain 21 and the line linking the second source 22 and second drain 23 intersect at a nearly right angle. In this embodiment, the channel width (indicated by a dimension "a" in FIG. 1A) formed between the first source 20, first drain 21, and the second source 22, second drain 23 is set specific at about 10 $\mu$m. The channel length (dimension "b" in FIG. 1A) formed between the second source 22 and second drain 23 is about 12 $\mu$m.

The width of the common gate (dimension "c" in FIG. 1A) is about 12 $\mu$m. In the illustrated embodiment, the three ends of the square of the common gate 24 are notched, but such notching is not particularly required.

FIG. 1B is a perspective sectional view of the device as seen from line 1B—1B in FIG. 1A, but the contact holes 25 are not shown here.

On a substrate 26, a diffusion layer 27a of the second source 22 and a diffusion layer 27b of the second drain 23 are formed, and a gate oxide film 28 is formed between the two diffusion layers 27a, 27b, and a common gate 24 is formed on the gate oxide film 28. Thus, the sectional structure of the device in the first embodiment is exactly the same as that of the conventional MOS type device. As the substrate 26 in the first embodiment, a (100)P-type silicon substrate (resistivity 8 to 10 ohm-cm) is used, and by implanting boron ions to the first source 20, first drain 21, second source 22 and second drain 23, P-type diffusion layers 27a, 27b, 29a, 29b are formed, corresponding to the second source 22, second drain 23, first source 20, and first drain 21, respectively. The diffusion layers 29a, 29b are not shown in FIG. 1B. The gate oxide film 28 is formed in a thickness of about 20 nm by steam oxidation. The common gate 24 is made of polysilicon formed by Chemical Vapor Deposition (CVD).

The other regions on the substrate 26 than the areas for composing the contact holes 25 and common gate 24 are coated with an insulation film 31.

Here, for the ease of understanding by comparing the device of the invention with the conventional MOS type device, an example of forming the device by using a single crystal silicon substrate 26 is described, but it is not necessary to use a single crystal substrate, and other substrates may be used such as polycrystalline substrate or film, amorphous substrate or film, and others on which diffusion layers to be used as source and drain may be formed, for example, compound substrates, SOI (silicon-on-insulator) and SOS (silicon-on-sapphire). Needless to say, instead of the embodiment of an N-channel type device using the P-type silicon substrate, the invention may be also applied to a P-channel type as well.

In this embodiment, the channel width "a" formed between the first, second sources 20, 22 and first, second drains 21, 23 is about 10 $\mu$m, and the channel length "b" is 12 $\mu$m, but the dimensions are not limited as far as a conventional MOS type device can operate, and a normal operation is guaranteed if the channel width "a" and channel length "b" are about 1.0 $\mu$m or more.

Figure 2A:
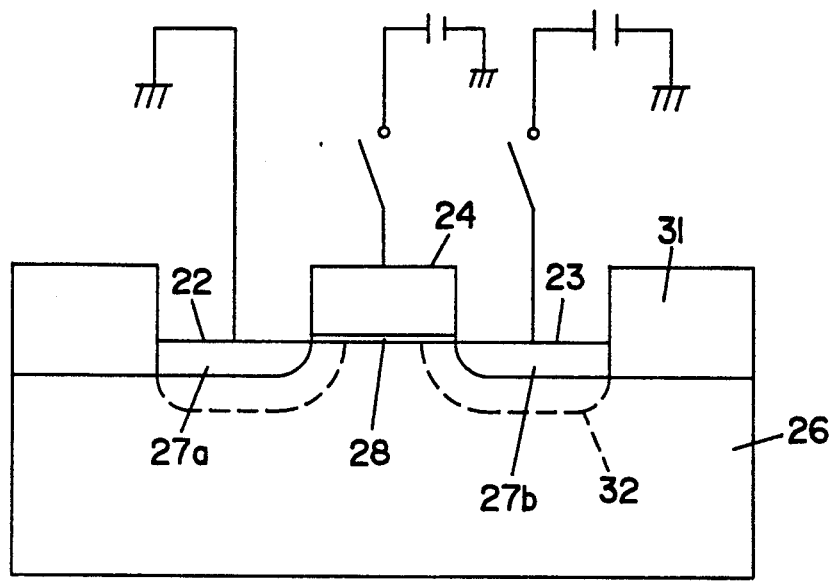

The operation of this device is explained particularly below while referring to FIG. 2. FIG. 2A is a sectional view of the device in line 1B—1B in FIG. 1A and the internal physical operation of the device is described referring to FIG. 2A.

FIG. 2A shows a floating state of the first source 20 and the first drain 21 by applying a specific potential between the second source 22 and second drain 23 and applying a specific voltage to the common gate 24. In FIG. 2A, the diffusion layer 27a of the second source 22, the diffusion layer 27b of the second drain 23, and the gate oxide film 28, and the common gate 24 are identical with those shown in FIGS. 1A, 1B. In this case, a depletion layer 32 is formed at the junction of the P-type diffusion layers 27a, 27b and the substrate 26.

Figure 2B:
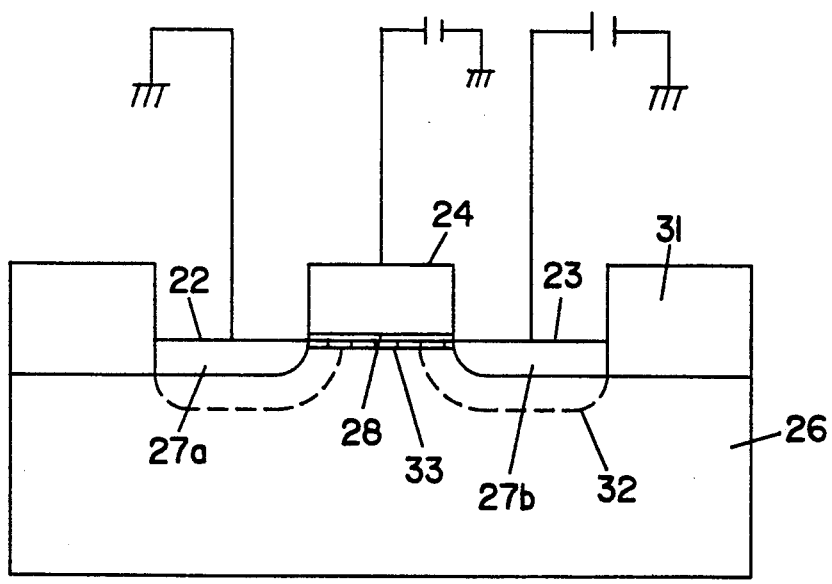

FIG. 2B shows a state which operating potentials are applied to the diffusion layers 27a, 27b and common gate 24. When a specified potential (e.g. 1.0 V) is applied between the common gate 24 and second drain 23, since the potential of the common gate 24 is higher than the threshold voltage of the transistor, a channel 33 called an inverted layer is formed on the surface of the silicon substrate 26 immediately beneath the gate 25 oxide film 28. The channel 33 is connected to the diffusion layer 27a and diffusion layer 27b. The electrons generated in the diffusion layer 27a move to the diffusion layer 27b through the channel 33 by the electric field generated between the source diffusion layer 27a and drain diffusion layer 27b, and therefore an electric current flows. This action is exactly the same as that of a conventional MOS type device.

As the potential of the second drain 23 is further heightened, the depletion layer 32 formed in the periphery of the junction between the second drain 23 and the silicon substrate 26 spreads widely. As the depletion layer 32 is spread, the channel 33 formed immediately beneath the gate oxide film 28 can no longer reach the diffusion layer 27b of the second drain 23 (pinch-off), and the current does not increase even if the drain voltage is further raised, thereby reaching the saturated state.

As in this embodiment, in the device having two sets of source and drain, when the potential is applied to the second source 22 and second drain 23, and simultaneously to the first source 20 and first drain 21, the channel 33 formed immediately beneath the common gate 24 changes corresponding to the potential of the second source 22 and second drain 23 and the potential of the first source 20 and first drain 21.

Thus, having plural pairs of source and drain, by varying the value of the potential applied to each source and drain, the drain current of the device may be intentionally increased or decreased. Besides, supposing one of the plurality of sources and drains to be a control terminal of the device having another source and drain pair, by applying an appropriate potential to the control terminal, the intrinsic characteristic may be varied, and the state of instability or drift in operation may be intentionally created.

FIG. 3A shows an equivalent circuit of the device of FIG. 1A. Between the first source 20 and first drain 21, MOS type transistors 34, 35 are connected in series. Between the second source 22 and second drain 23, MOS type transistors 36, 37 are connected in series. The gates of these four MOS type transistors 34, 35, 36 37 are common gate 24. Furthermore, the sources and drains of the MOS type transistors 34, 35, 36, 37 are connected at one point 38.

Incidentally, the equivalent circuit of the device shown in FIG. 1A may be expressed also as shown in FIG. 3B. That is, a MOS type transistor 41 is formed between the first source 20 and first drain 21, and a MOS type transistor 42 between the second source 22 and second drain 23. Between the first source 20 and second drain 23, a MOS type transistor 43 is formed. Between the second drain 23 and first drain 21, a MOS type transistor 44 is formed, and between the first drain 21 and second source 22, a MOS type transistor 45 is formed. Furthermore, between the second source 22 and first source 20, a MOS type transistor 46 is formed. These MOS type transistors 43 to 46 share common gate 24.

The operation of this circuit is explained below. Assuming the first source 20 and first drain 21 to be source and drain of a device, respectively, the operating potential applied to the second source 22 and second drain 23 acts as a disturbance factor to cause instability or drift in the device characteristic of the device having the first source 20 and first drain 21 as source and drain, respectively. While the second source 22 and second drain 23 are in floating state, this device acts exactly the same as the conventional MOS type device. That is, a potential is applied to the common gate 24, and a channel is generated immediately beneath the common gate 24. Sequentially, depending on the potential applied to the first source 20 and first drain 21, a current flows in the channel area and the MOS type device operates.

Figure 4A:
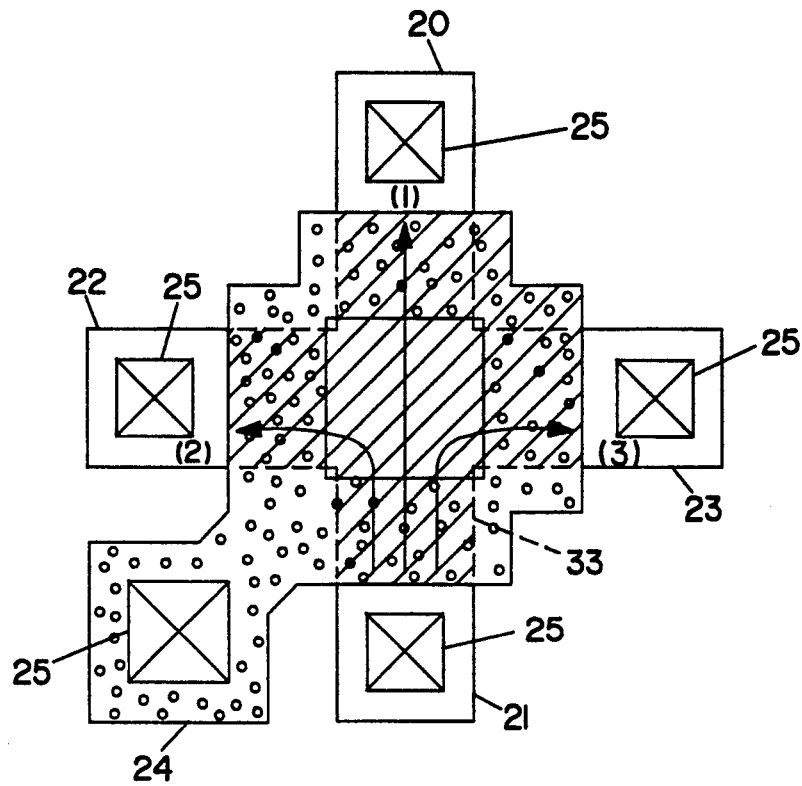

FIG. 4A shows the flow of current occurring when the second source 22 and second drain 23 are grounded. In FIG. 4A, the source, drain and gate are in the same composition as shown in FIG. 1A. The shaded area in FIG. 4A shows the generation region of the channel 33 beneath the gate electrode when a voltage over the threshold voltage is applied to the common gate 24. The arrows 1, 2, 3 in the shaded area indicate the flow direction of the current passing through the channel. When the first source 20 is grounded and a voltage is applied to the first drain 21, the drain current flows in the direction of arrow 1. On the other hand, when the second source 22 and second drain 23 are grounded, the three MOS type transistors operate simultaneously. That is, the MOS type transistor having the first source 20 as the source and the first drain 21 as the drain (in FIG. 3B, the MOS type transistor 41 corresponds to such transistor, and the flow of the current in FIG. 4A corresponds to the direction of arrow 1), the MOS type transistor having the second source 22 as the source and the first drain 21 as the drain (in FIG. 3B, the MOS type transistor 45 corresponds to such a transistor, and the flow of current in FIG. 4A corresponds to the direction of arrow 2), and the MOS type transistor having the second drain 23 as the source and the first drain 21 as the drain (in FIG. 3B, the MOS type transistor 44 corresponds to such transistor, and the flow of the current in FIG. 4A corresponds to the direction of arrow 3) compose a device comprising one drain and three sources.

When the second source 22 and second drain 23 are grounded, as compared with the conventional MOS type transistor having the second source 22 and second drain 23 in a floating state (without fixing the voltage), a current of about 1.4 times flows in the first drain 21.

When the MOS type transistor possesses a common gate, that is, in the device in FIG. 4A, in the case where the MOS type transistors 41, 44, 45 possess the common gate 24, but not common channel, the drain current is merely obtained by the sume of the drain currents flowing through the transistors 41, 44, 45. However, the characteristics of the drain current obtained in the device of this embodiment is varied more than in the case of the conventional MOS type element possessing a common gate.

Figure 4B:
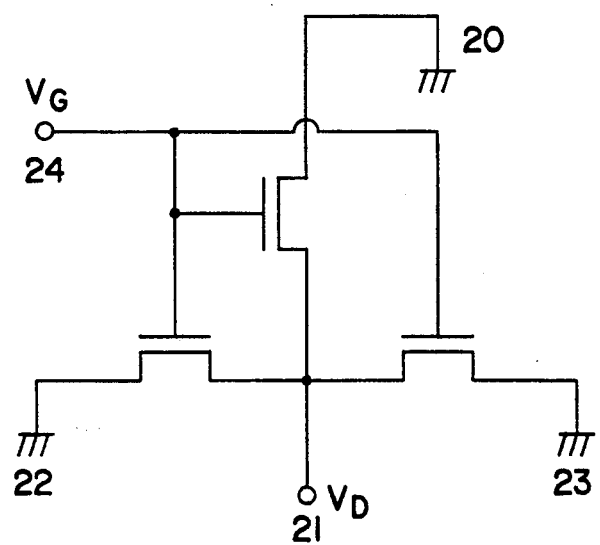

In this embodiment, the first source 20, the second source 22 and the second drain 23 are all grounded and are at same potential. A specific potential is applied only to the first drain 21, and therefore there is no potential difference between the first source 20 and second source 22, and between the first source 20 and second drain 23, and the elements formed between them do not operate. Generally, it is not required that the potential be identical between the first source 20 and second source 22, and between the first drain 21 and second drain 23, and hence the first source 20, first drain 21, second source 22 and second drain 23 may be individually fixed at different potentials. As a result, as shown in FIG. 4B, it may be possible to assume an equivalent circuit having the MOS type transistor disposed between the terminals.

As in the general MOS type transistor, also in the device shown in FIG. 1B, the drain current increases as both the gate voltage and drain voltage rise. This characteristic is fundamentally the same as the general MOS type transistor.

In fact, for example, when a specific voltage is applied to the first source 20 and first drain 21, and the other second source 22 and second drain 23 are in floating state, the same characteristics as the conventional MOS type transistor are obtained.

Figure 5:
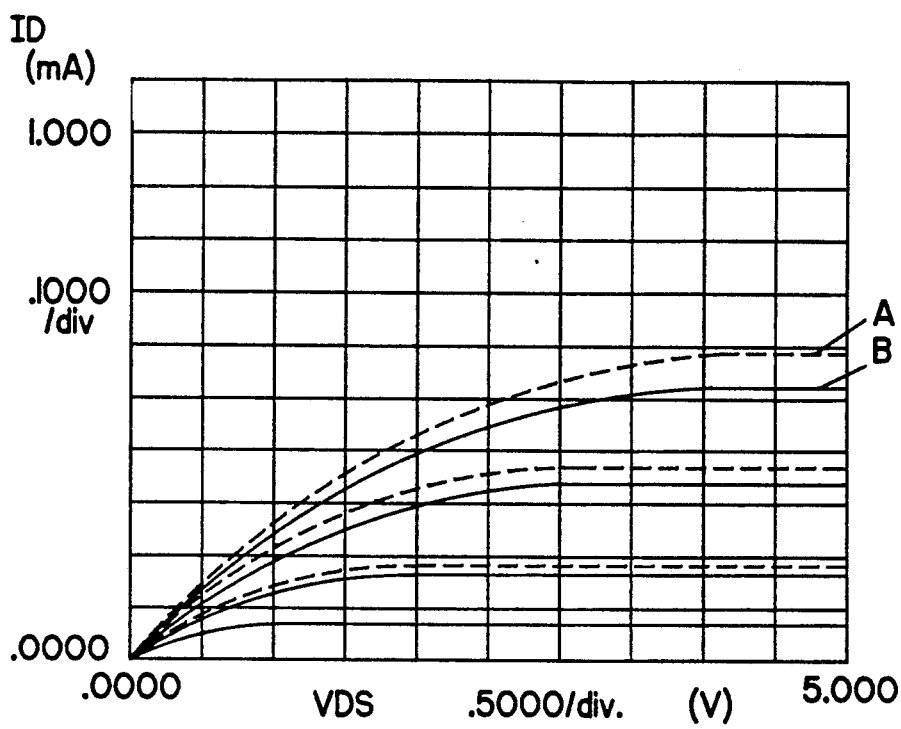
FIG. 5 is a diagram showing the characteristic of the semiconductor device in FIGS. 1A, 1B.

FIG. 5 shows the drain voltage-drain current characteristic when two out of four terminals of the device shown in FIG. 1A are floating. Hereinafter the terminals are not called by the names of source and drain. This is because the terminals may become either source or drain depending on the applied potential. In correspondence to FIG. 1A, the first source 20 is terminal T1, the first drain 21 is terminal T3, the second source 22 is terminal T2, and the second drain 23 is terminal T4.

When two of the terminals of the device are floating in this way, two types of MOS type transistors differing in the channel shape are selected.

In FIG. 5, the broken line A refers to the relation between the drain-source voltage and the drain current of the device having terminals T3 and T4 in floating state, using the terminal T2 as the drain for applying a potential of 0 to 5 V and terminal T1 as the source with the potential set at 0 V. At this time, the potential of the common gate 24 varies from 0 to 5 V.

Thus, in the broken line A, the two terminals corresponding to the source and drain are disposed at a right angle. Accordingly, the channel region is bent almost at a right angle and the drain current flowing between the vertically arranged source and drain can be measured.

The solid line B shows the variation of the potential from 0 to 5 V in which all potentials of the terminals T2 and T4 are in floating states, the potential of terminal T1 is 0 V, and the terminal T3 is the drain. The potential applied to the common gate 24 is changed from 0 to 5 V.

Thus, in the solid line B, the two terminals corresponding to the source and drain are disposed linearly. Accordingly, the channel region is rectangular, same as in the ordinary MOS type transistor.

In the drain voltage-drain current characteristics in both broken line A and solid line B, as the gate voltage and drain voltage rise, the drain current increases, and above a certain drain voltage, there is a tendency of saturation of the drain current by pinchoff.

Generally, the drain current of the MOS type element is inversely proportional to the channel length and normally proportional to the channel width as shown in formula (1).

$$ID \alpha W/L \tag{1}$$

Comparing the W/L (ratio of mean channel width (W) to mean channel length (L)) of MOS type transistors of the above two curves (A and B), it is found $$(W/L)A:(W/L)B = 1:0.90 \tag{2}$$

and the drain current obtained by measurement is $$(ID)A:(ID)B = 1:0.88 \tag{3}$$

when a satisfactory correspondence is acknowledged.

That is, having plural pairs of source and drain, by varying the value of the potential applied to the individual sources and drains, the drain current flowing in the device may be intentionally increased or decreased. Accordingly, assuming one of the plurality of sources and drains to be a control terminal of the device possessing another pair of source and drain, by applying an appropriate potential to the control terminal, the intrinsic characteristic of the device may be changed, so that the state of instability or drift in operation may be intentionally created.

Figure 6:
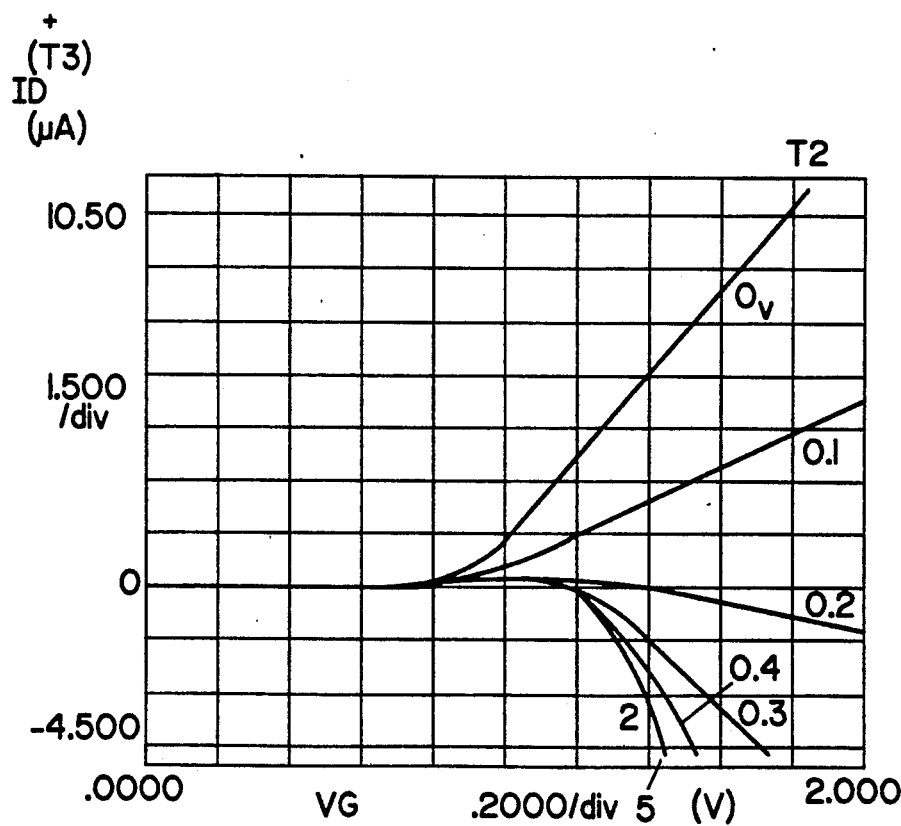
FIG. 6 is a diagram showing the characteristic of the semiconductor device in FIGS. 1A, 1B.

FIG. 6 shows an example of measurement of gate voltage and drain current when a voltage is applied to the three terminals. In FIG. 6, a potential of 0 V is applied to terminal T1, 0.1 V to terminal T3, 0 V to terminal T4 and 0 V to the substrate. The potential of terminal T2 is varied in a range of 0 to 5 V, and the gate potential is varied in a range of 0 to 2 V.

This device is regarded as a MOS type transistor having the terminals T1 and T4 as the source and the terminal T3 as the drain. The threshold voltage of the thus formed MOS type transistor is about 0.7 V, and hence the drain current flowing from terminal T3 begins to flow at the gate potential of 0.7 V or more. However, when the voltage applied to the terminal T3 is gradually raised, the drain current flowing from the terminal T3 gradually decreases and finally begins to flow in the reverse direction.

It means that, as the potential of the terminal T2 is raised, the MOS type transistor having the terminal T2 as the drain begins to operate, in addition to the drain current of the terminal T3 flowing in the MOS type transistor having the terminals T1 and T4 as the source which had been operating so far. That is, in order to cause the terminals of the MOS type device to operate as the source or drain, it merely depends on which terminal is higher in potential. Therefore, if the potential of the terminal T2 is 0 V, the terminal T3 which is the drain is known to change to the source from around the point where the potential of the terminal T2 is about to exceed 0.1 V. What should be noted here is that the drain current is flowing in the terminal T2 even if the potential of the terminal T2 is 5 V and the potential of the gate is about 0.8 V.

More specifically, since the terminals T1 and T2 which are the source are at the same potential as the substrate, that is, 0 V, the threshold voltage of the MOS type device having the first operating terminal T2 as the drain is about 0.8 V. By contrast, the potential of the source which is the terminal T2 of the second operating MOS type element is 0.1 V higher than that of the substrate. As a result, a substrate bias sensitivity (body-effect) takes place, and the threshold voltage becomes about 1.0 V, and the gate potential operates at over 1.0 V, so that such drain current flows.

That is, when a voltage is applied to other terminals than the source and drain of the MOS type device to be observed, the original characteristic of the MOS type device may be varied.

In this way, assuming one of the plural sources and drains to be the control terminal of the device having another source and drain pair, by applying an appropriate potential to the control terminal, the intrinsic characteristic of the device may be varied, and the state of instability of drift may be intentionally created.

Figure 7:
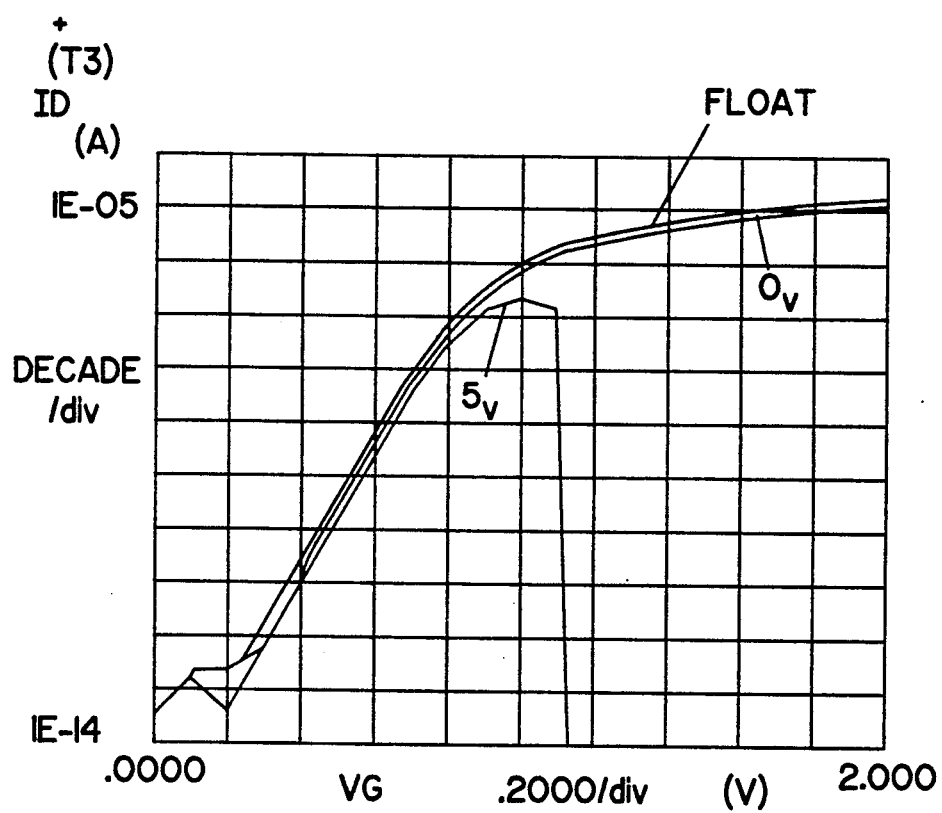
FIG. 7 is a diagram showing the characteristics of the semiconductor device in FIGS. 1A, 1B.

FIG. 7 shows the result of measurement of gate voltage and drain current in order to show that the apparent threshold voltage can be changed. In FIG. 7, the potential of the terminal T1 is 0 V, the terminal T2 is opened, the potential of terminal T3 is 0.1 V, and the potential of the terminal T4 is fixed at 0 V. Furthermore, the gate potential is changed in a range of 0 to 2 V, and the diagram shows the gate voltage dependence of the drain current flowing in the terminal T3 when 0 V is applied to the substrate.

In such a device, the MOS type transistor is composed by using the terminals T1 and T4 as the source and T3 as drain. In the floating state in which the terminal T2 is opened, the potential of the terminal T2 is an intermediate value of the potential of the source and drain. When the potential of the terminal T2 is fixed at 0 V, the drain current flowing in the terminal T3 decreases. When the potential of the terminal T2 is raised, the terminal T2 acts as the drain, and the terminal T3 changes its role from drain to source. In other words, when the potential of the terminal T2 is varied in a range of 0 V to about drain potential, the characteristic is revised to have the threshold voltage about 0.05 V larger. The drain current flowing in terminal T3 at this time decreases about 50%.

In FIGS. 4A and 4B, an example of increase of the drain current by application of specific potential to other terminals than the source and drain is shown. However, the obtained value is only a smaller current than the drain current flowing in the ordinary MOS type transistor used by sharing the gate. On the other hand, in FIG. 6 and FIG. 7, when a specific potential is applied to the other terminals than source and drain, the drain current decreases. These results are not contradictory, but differ depending on which terminals are regarded as the source and drain of the MOS type transistor.

To understand the characteristic of the device shown in FIG. 1A, another extreme structure is discussed below.

Figure 8:
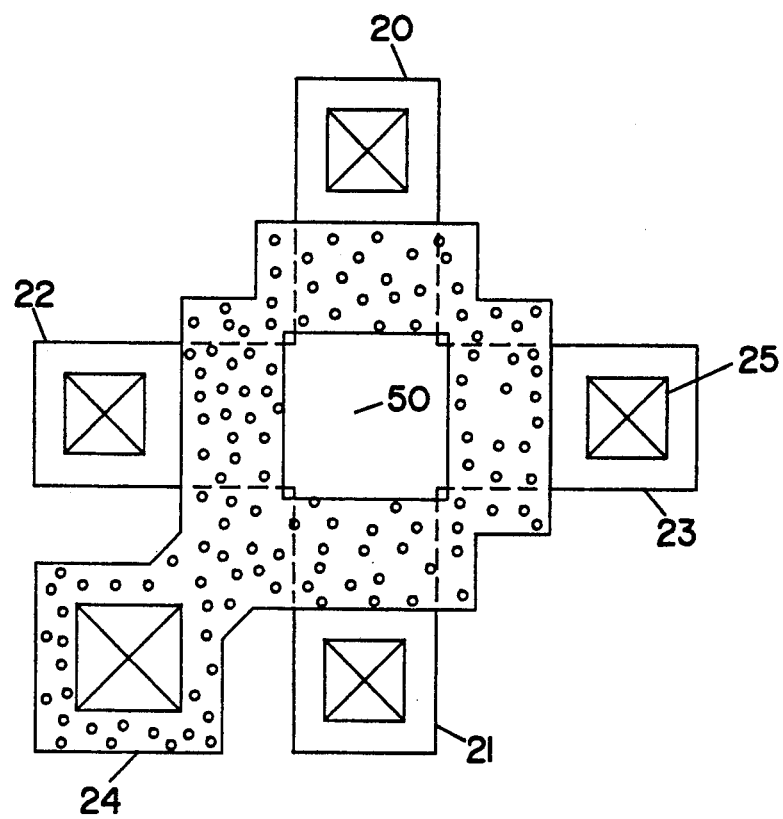
FIG. 8 is a plan view showing the extreme structure of a semiconductor device of the invention.

FIG. 8 shows an element having the middle portion cut out from the common gate 24 in the device shown in FIG. 1A. The middle portion of the common gate 24 of the first source 20, first drain 21, second source 22, second drain 23 is cut out, so that the potential induced in the diffusion layer 50 in the middle portion can be taken out independently of the potential applied to other terminals.

The device shown in FIG. 8 corresponds exactly to the equivalent circuit of the device shown in FIG. 3A.

By considering the potential of the diffusion layer 50 in the center portion of the common gate 24, it is enough to estimate how the voltage is distributed and applied to the four MOS type transistors, 34, 35, 36, 37 in FIG. 3A. Since the four MOS type transistors shown in FIG. 8 are exactly the same in shape and size, a difference in drain voltage occurs depending on the applied voltage, in particular, the potential difference of the source and drain (in this case, the gate voltage is common).

Figure 9A:
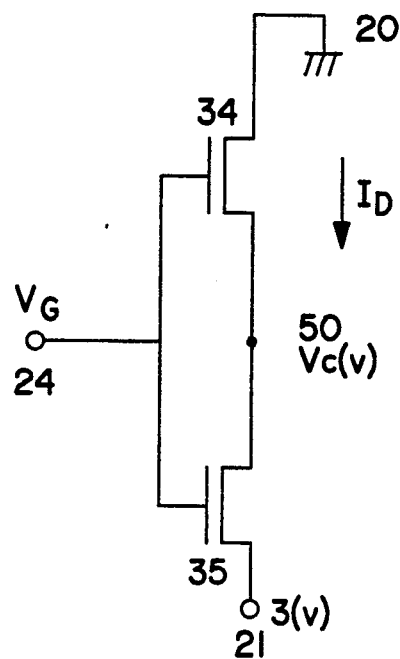
FIG. 9A, FIG. 9B are equivalent circuit diagrams of the semiconductor device in FIG. 8.

By grounding the first source 20 and applying a potential of 3 V to the first drain 21, when the second source 22 and second drain 23 are in a floating state, the potential of the diffusion layer 50 in the center portion of the common gate 24 is an intermediate value of 0 and 3 V (this value is called Vc hereafter). That is, a MOS type transistor using the first source 20 as the source, the diffusion layer 50 as the drain, and applying Vc to the drain, and a MOS type transistor using the diffusion layer 50 as the source, the first drain 21 as the drain, and applying a potential of Vc to the source and 3 V to the drain are arranged in series. The circuit diagram in this state is shown in FIG. 9A.

Figure 9B:
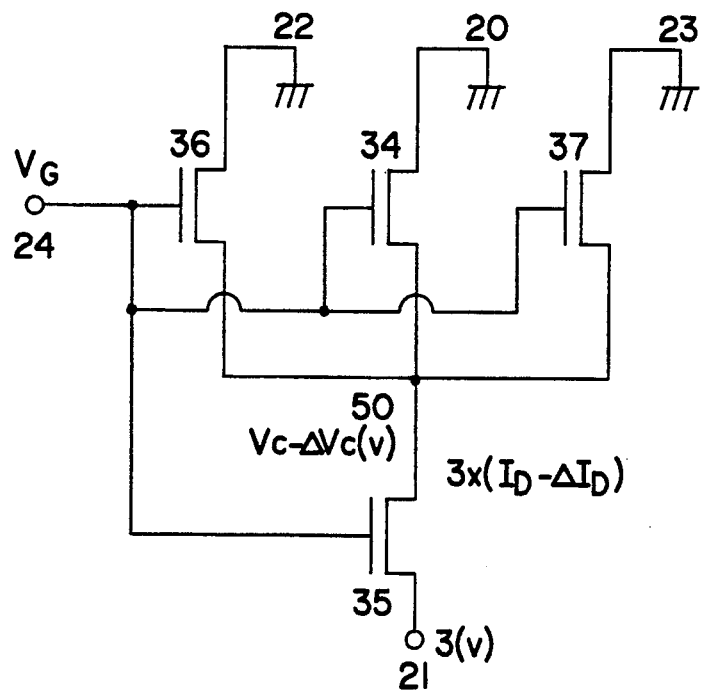

FIG. 9B shows a circuit diagram in a state of grounding the second source 22 and second drain 23. The potential of the diffusion layer 50 is lowered from the potential Vc by $\Delta Vc$ to be $Vc - \Delta Vc$. As a result, the drain current flowing in the MOS type transistor 34 in FIG. 9B decreases by $\Delta AD$. The three MOS type transistors 34, 36, 37 have substantially identical size, and hence a nearly equal drain current flows in the three MOS type transistors 34, 36, 37. Accordingly, the total drain current is $3 \times (ID - \Delta ID)$, and the total drain current increases.

As explained in FIGS. 4A and 4B, when the current of the first drain 21 is compared with the ordinary MOS type transistor having the second source 22 and second drain 23 in floating (without fixing voltage) state, a current of about 1.4 times flows when the second source 22 and second drain 23 are grounded, which is because the drain current is determined by the function stated above. The drain current $\Delta AD$ at this time is calculated to reach about 50% of the drain current ID.

The difference between the device shown in FIG. 1A and the device having the extreme structure shown in FIG. 8 is that the size of the device in FIG. 1A determined by the channel length and channel width varies with the condition of the potential applied to the terminals, while the device shown in FIG. 8 does not have four MOS type elements of nearly same channel length and channel width in a symmetrical element because the channel is formed only immediately beneath the common gate. Accordingly, the size of the device is determined when the device if formed in the substrate. Depending on the condition of the potential applied to the terminals, the potential of the diffusion layer 50 varies, and the operation of the entire circuit formed by four MOS type transistors changes. That is, in the device shown in FIG. 1A, since the channel region is shared by plural MOS type transistors, according to the operation of one MOS type transistor, the effective channel length and channel width of other MOS type transistors are changed. Therefore, in the element shown in FIG. 1A, rather than the circuit shown in FIG. 8, the terminals are connected with each other and are mutually affecting more organically. Besides, from the aspect of formation of device, the device shown in FIG. 1A is more advantageous than the device shown in FIG. 8 because it is not necessary to form a gate for forming the diffusion layer 50, so that the device may be designed in a more delicate dimension and in more complicated shape.

Actually, the device shown in FIG. 1A is different from the device shown in FIG. 8 because the channel region of the MOS type transistor is shared. Therefore, the drain current is determined by a more complicated mechanism. Having plural pairs of source and drain, by varying the value of the potential applied to each source and drain, the drain current flowing in each transistor may be intentionally increased or decreased. Therefore, assuming one of the plural sources and drains to be a control terminal of the device having another pair of source and drain, by applying a proper potential to the control terminal, the intrinsic characteristic of the device may be varied.

Figure 10:
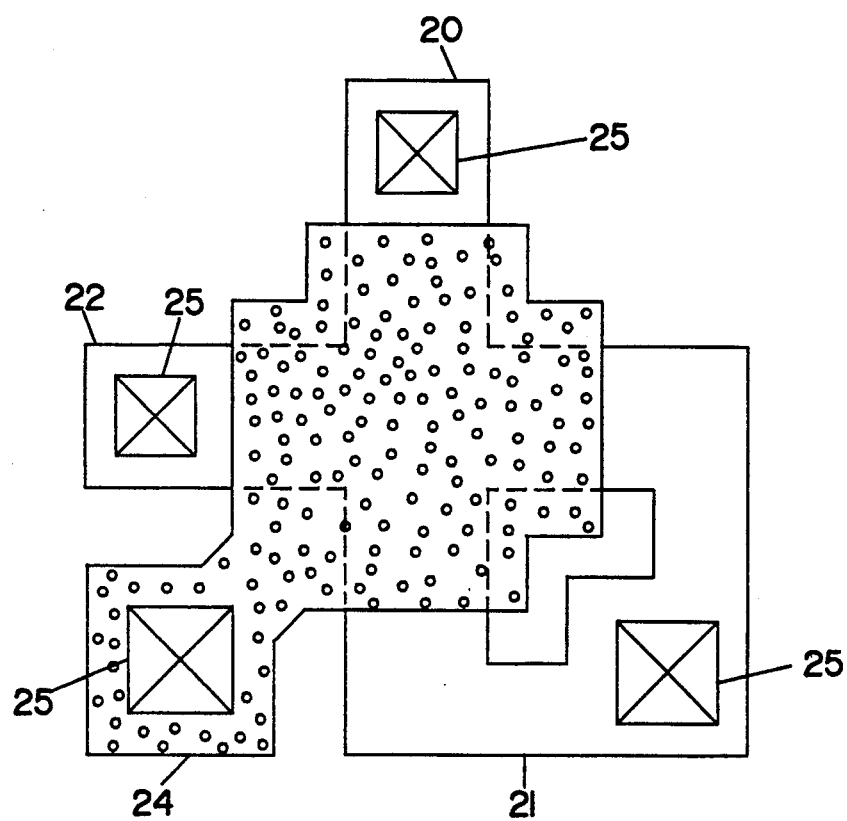
FIG. 10 is a plan view of a semiconductor device according to a second embodiment of the invention.

FIG. 10 shows a first embodiment of the device having a modified structure of the device shown in FIG. 1A. In FIG. 10, a diffusion layer of a set of first source 20 and first drain 21, and a set of second source 22 and a second drain 23 is formed. At this time, the first drain 21 and second drain 23 in FIG. 1A are connected with a common P-type diffusion layer. Here, the first drain 21 and second drain 23 are collectively called the first drain 21. A common gate 24 is formed in the region to become the gate of the diffusion layer of the first source 20 and first drain 21 and the diffusion layer of the second source 22 and first drain 21.

To achieve electric connections with the diffusion layers, contact holes 25 are formed in the diffusion layer of the first source 20 and first drain 21, and the diffusion layer of the second source 22 and second drain 23. A contact hole 25 of the common gate 24 is formed in a region not electrically contacting with other diffusion regions.

The line linking the first source 20 and the first drain 21, and the line linking the second source 22 and first drain 21 intersect with each other at nearly a right angle.

A characteristic feature of the element shown in FIG. 10 is that the device characteristic of specific source and drain is varied by applying a specific voltage to other source and drain terminals. Thus, when the drain is used commonly, only one other terminal is sufficient. Therefore, the desired function may be achieved in a structure having at least three source and drain terminals.

Figure 11B:
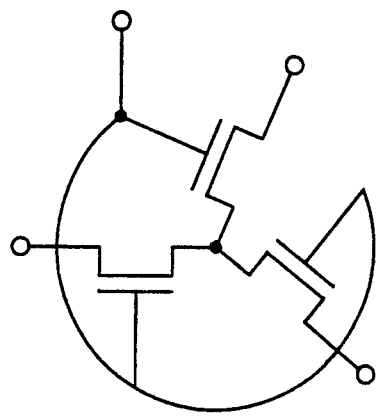
FIG. 11B, FIG. 11C are equivalent circuit diagrams of the semiconductor device in FIG. 11A, FIG. 12A, FIG. 12B, FIG. 12C are plan views of semiconductor devices in fourth, fifth and sixth embodiments of the invention.
Figure 11C:
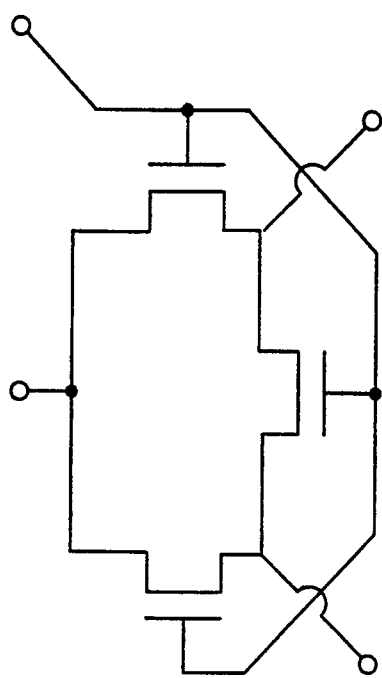
Figure 11A:
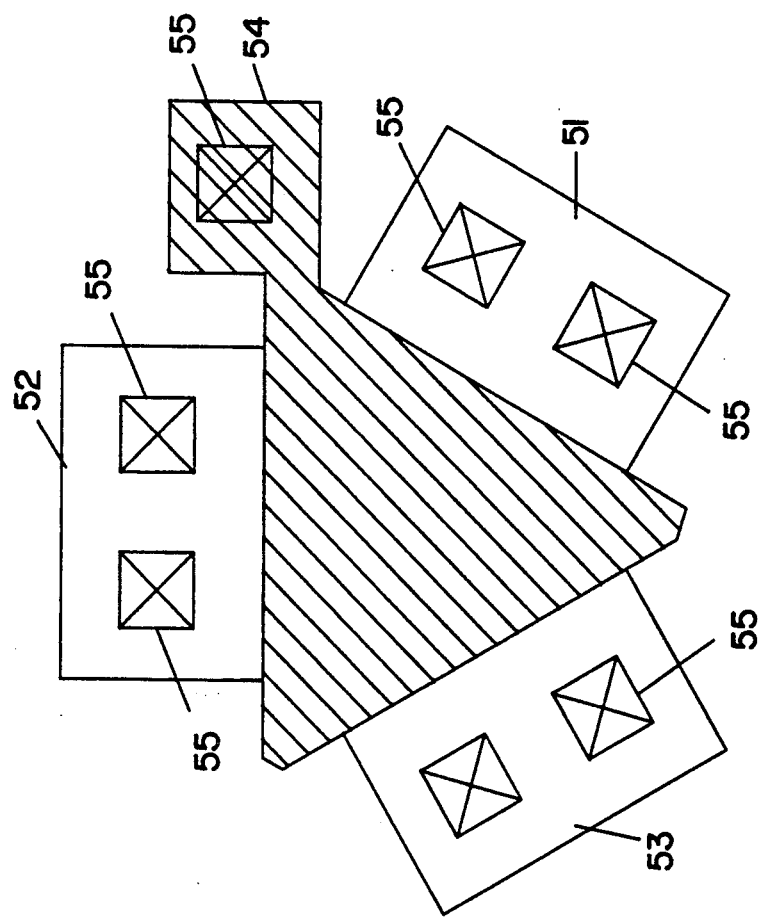
FIG. 11A is a plan view of a semiconductor device according to a third embodiment of the invention.

As a second example of the device having a modified structure of the element shown in FIG. 1A, an embodiment of a device having three terminals each is shown in FIG. 11A. Its equivalent circuit is shown in FIGS. 11B, 11C.

In FIG. 11A, numerals 51, 52, 53 are source or drain terminals. In this example, since the width of the three terminals 51, 52, 53 is equal, it is formed in an equilateral triangle. Furthermore, in the region enclosed by the terminals, a common gate 54 is formed. Moreover, contact holes 55 are formed in the terminals 51, 52, 53 and common gate 54, and a potential may be applied to the terminals 51, 52, 53 and common gate 54 through these contact holes 55 at the time of operation of the device.

Instead of the equilateral triangle in the channel region enclosed by the terminals 51, 52, 53, any triangle may be formed by varying the width of the terminals.

Four or more terminals may be used as well. In this case, however, the channel length tends to be longer as compared with the channel width, and it is inferior as the characteristic of the MOS type device.

In the elements shown in FIG. 1A and FIG. 11A, the terminals corresponding to the source and drain are symmetrical. That is, the device characteristic is not changed at all if the first source 20 and second source 22, or the first drain 21 and second drain 23 are exchanged with each other. Accordingly, about the middle of the common gate 54, by rotating 90 degrees in FIG. 1A or 120 degrees in FIG. 11A, even if operated by applying the above potential to the terminals, the same device characteristic is obtained.

In such elements, however, it is not absolutely essential that the terminals be symmetrical. That is, by applying a potential to a specific terminal, the function of controlling the current flowing in to other terminals is achieved by an asymmetrical structure not allowing exchange of the terminals. Therefore, the manner of operation of individual source terminals, drain terminals and control terminals may be fixed.

Figure 12A:
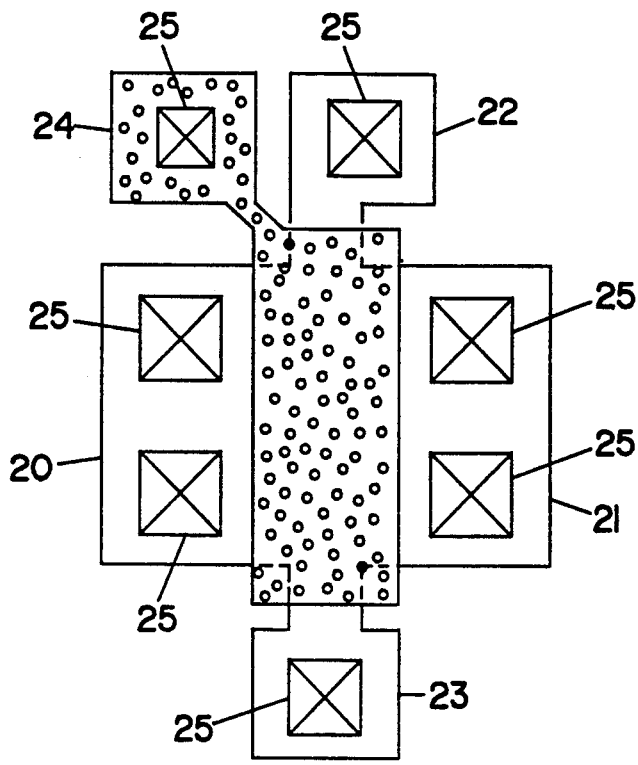
Figure 12B:
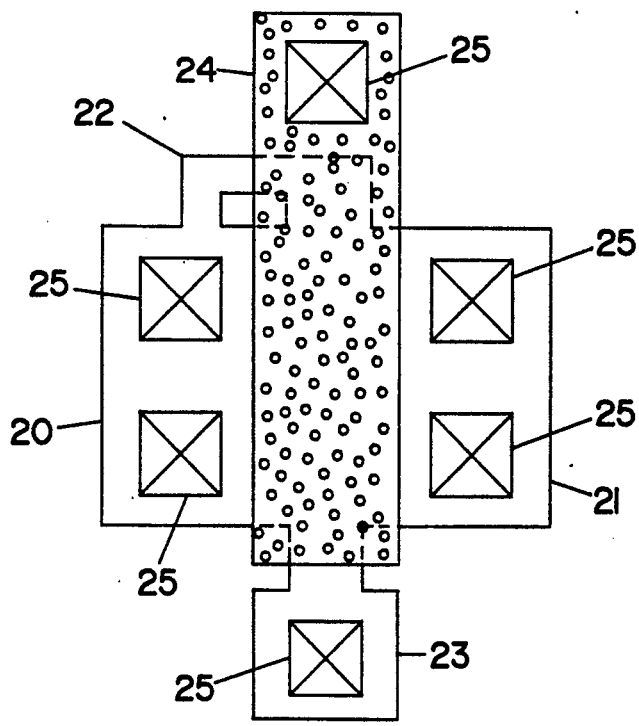
Figure 12C:
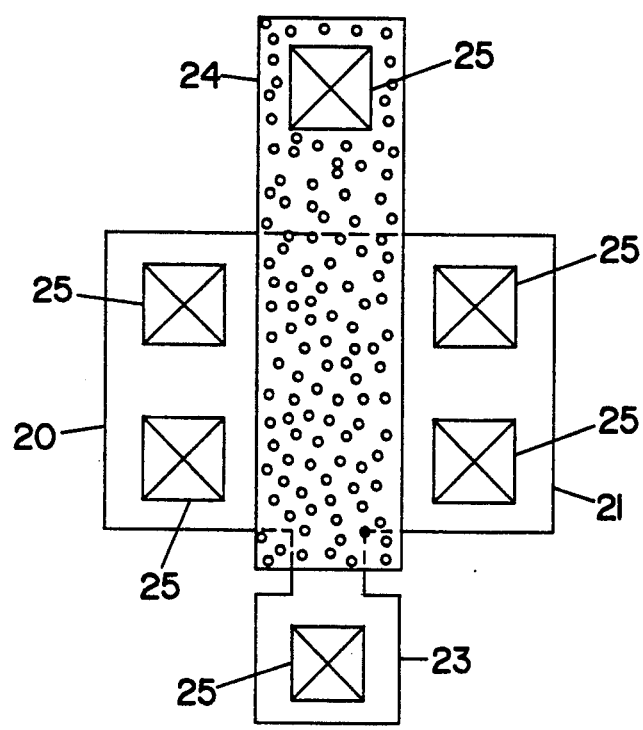

FIGS. 12A, 12B, 12C refer to embodiments composed so as to control the drain current flowing in a specific MOS type element by making common the channels of the other device, with respect to the channel of the specific MOS type device. Here, the width of the channel region formed between the first source 20 and first drain 21 is set about 10 to 20 times larger than the width of the channel region formed between the second source 22 and second drain 23. In such a structure, however large or small may be the potential applied to the source and drain terminals of the MOS type device than the specific MOS type device, the drain current flowing in the specific MOS type device can be changed by only about 5 to 10%. That is, in this range, the characteristic of the specific MOS type device can be varied only very slightly by the potential applied from outside.

In FIG. 12A, there are two other control terminals, the second source 22 and second drain 23, with respect to the specific MOS type transistor possessing the first source 20 and first drain 21.

In FIG. 12B, in a specific MOS type transistor possessing the first source 20 and first drain 21, the other two control terminals, second source 22, is connected to the first source 20.

In FIG. 12C, there is only second drain 23 as the other control terminal in the specific MOS type transistor possessing the first source 20 and first drain 21.

Figure 13:
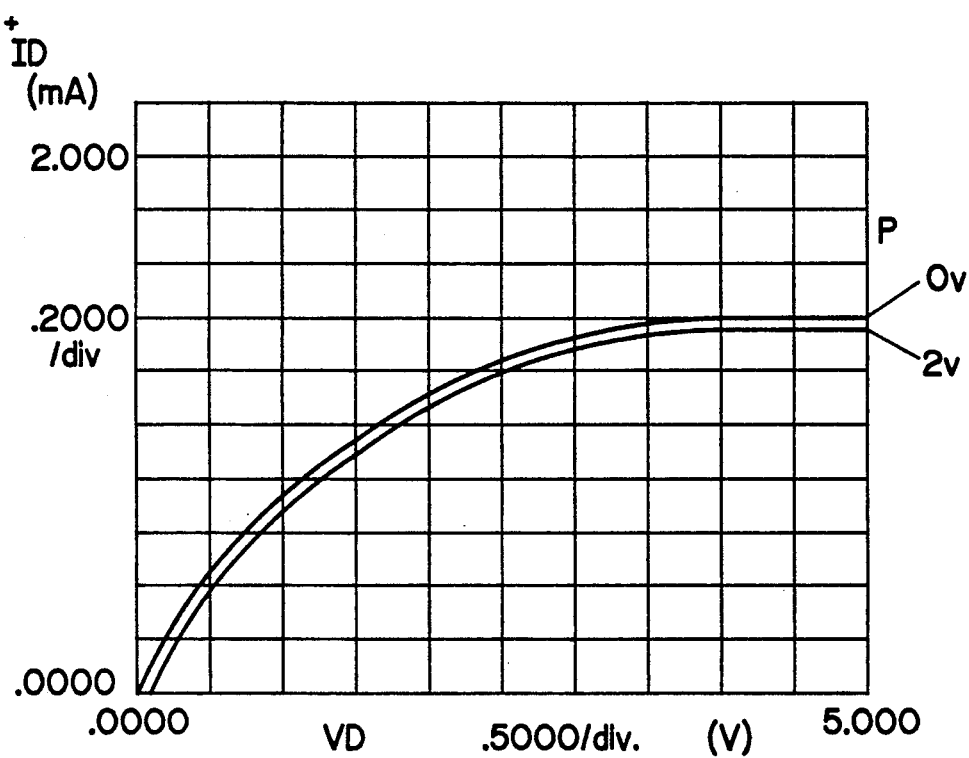
FIG. 13 is a diagram showing the characteristic of the semiconductor device in FIG. 12C.

FIG. 13 shows the relation between the drain potential and drain current of the device shown in FIG. 12C.

A potential of 0 V is applied to the first source 20 and substrate, and a potential of 5 V to the common gate 24. Potentials of 0 V and 2 V are applied to the second drain 23 to be used as parameters. To the first drain 21, a potential in a range of 0 to 5 V is applied.

The device structure shown in FIG. 12C adds a second drain 23 as a control terminal to the ordinary MOS type transistor with the channel width of 20 $\mu$m and channel length of 2 $\mu$m. The added MOS type transistor has the channel length of about 2 $\mu$m and channel width of about 1 $\mu$m, and the drain current flowing at this time is about 1/20 of the usual current. When potentials of 0 V, 2 V are applied to the second drain 23 which is the control terminal, it is known that the flowing drain current fluctuates about 5%. Therefore, by applying an arbitrary potential to the control terminal from outside, it is known that the characteristic of the specific MOS type transistor is changed.

The following effects are realized by using the device shown in FIG. 12C.

The electric characteristic of the ordinary MOS type transistor is determined when forming the element as described herein. Accordingly the control is affected to satisfy the specific standard, but it is judged whether the standard is satisfied or not only by the evaluation after formation of the device.

On the other hand, to optimize the circuit operation or to design the circuit, the device is experimentally formed to collect the date of the device characteristic, and the data is fed back to the design to form a desired circuit. However, if the electric characteristic of the device can be modified after forming the device, it is possible to control so as to present the device characteristic of the highest performance. Thus, since the circuit is composed so as to change the device characteristic after the formation of the device, it is not required to replace all devices with the devices shown in FIG. 12C, and only specific devices largely affecting the circuit characteristic may be modified. At this time, the potential to be applied to the control terminal of the replaced device may be fixed at a specific external potential through an output terminal, or the potential may be applied to the control terminal through a feedback loop so as to be adjusted by self-matching. Thus, the element with excellent performance may be formed at a high yield, and optimization of the circuit operation or data collection in designing of circuit may be done easily.

In the device shown in FIG. 1A, the majority of the channel region overlaps with four MOS type transistors. Accordingly, the drain current flowing in each MOS type transistor is exposed to the effect to the maximum effect by the potential applied to the transistors. The degree of such effect may be varied arbitrarily. That is, by reducing the overlap of the channel region, the mutual effect may be decreased.

Figure 14:
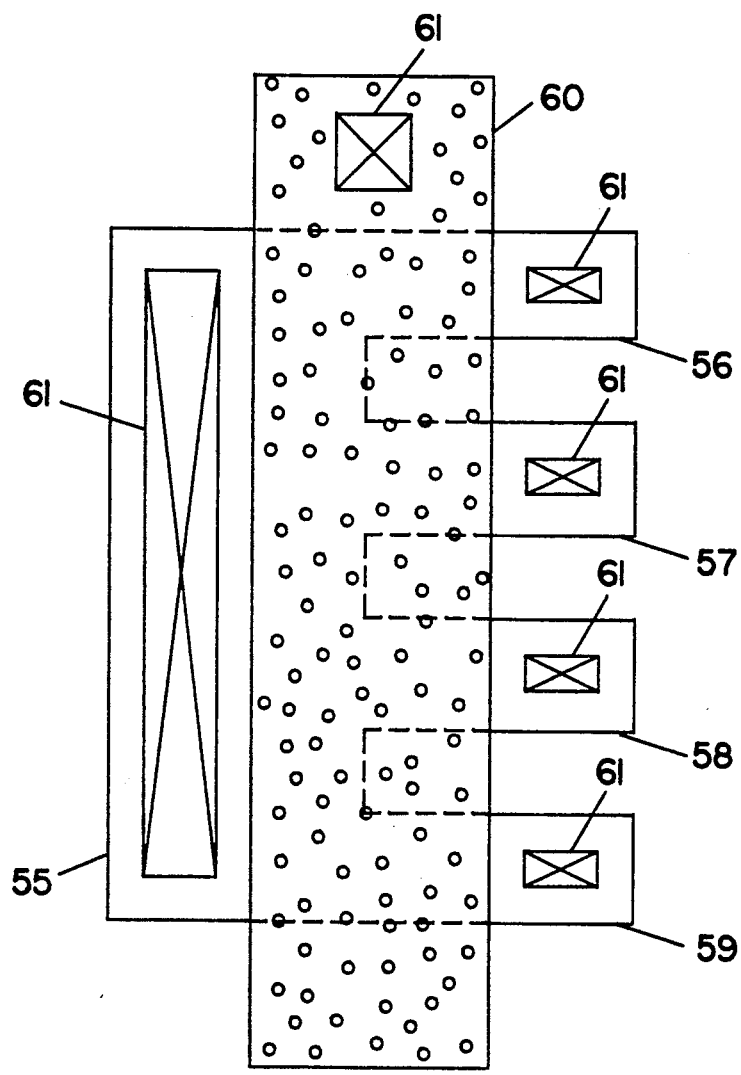
FIG. 14 is a plan view of a semiconductor device according to a seventh embodiment of the invention.

An embodiment of an element intended to reduce the overlap of the channel region is shown in FIG. 14. In FIG. 14, a first source 55 is common, and in order to reduce the overlap of the channels formed by each pair of drain and source, four drains (first drain 56, second drain 57, third drain 58, fourth drain 59) are disposed parallel to each other. Furthermore, a common gate 60 is formed in the region enclosed by the first source 55 and the four drains 56 to 59. In addition, contact holes 61 are formed in the first source 55, four drains 56 to 59, and common gate 60.

At this time, since the channel regions overlap only by about 20 to 30%, the rate of the drain current influenced by the potential applied to other drain terminals is about 20% only. By such configuration of the sources and drains, the degree of mutually affecting with other drain terminals may be arbitrarily set.

As explained herein, the devices shown in FIG. 1A and FIG. 11A can possess characteristics that cannot be obtained in the device formed merely by combining the conventional MOS type transistors. By the potentials applied mutually to other transistors, the drain current flowing in the specific MOS type transistor varies, and this characteristic is convenient for composing the circuit of complicated and mutual connections such as the neuron (nerve circuit).

In other words, as shown in FIGS. 3A and 3B, in spite of one device, the same operation as the circuit composed of four or six MOS type transistors is realized, and therefore the area for disposing the device may be reduced to 20 to 50%.

Figure 15:
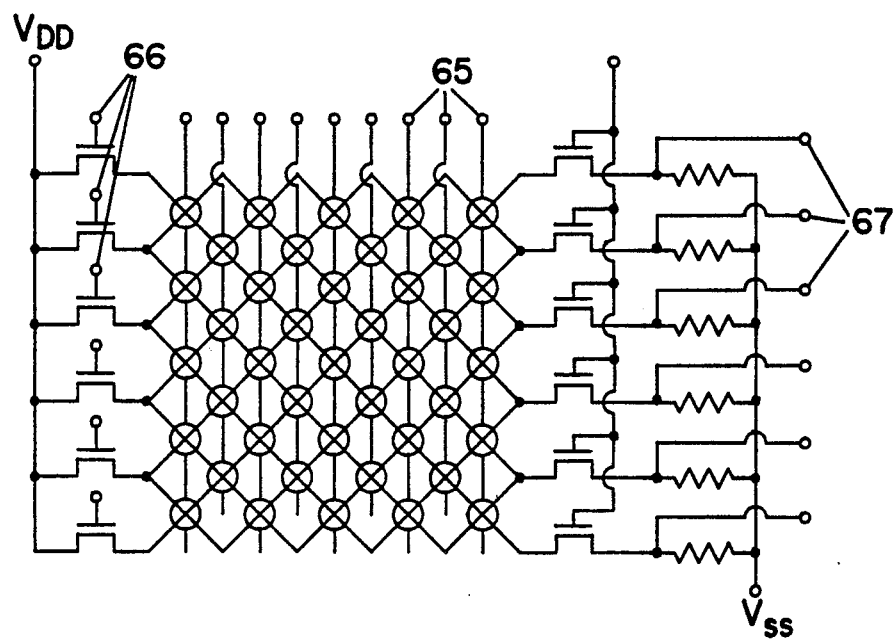
FIG. 15 is a circuit diagram showing an example of a circuit using the semiconductor device of the invention.

FIG. 15 shows an embodiment of a circuit composed by using the devices shown in FIG. 1A.

The device shown in FIG. 1A is indicated by the o mark, and the x mark in the o mark refers to the four straight lines seen from the center of the x, corresponding respectively to the first source 20, first drain 21, second source 22 and second drain 23. The straight line above and below the o mark indicates the common gate 24. Thus formed devices, 41 devices in this example, are arranged in matrix, and the gate is common in the vertical direction, and the gate terminals are as many as the number of rows of arrangement, or nine gate terminals 65 in this example. Each element form a part of the input terminal 66 and a part of the output terminal 67 by mutually connecting the first source 20 and first drain 21. Moreover, each element is forming a part of the input terminal 66 and a part of the output terminal 67 by mutually connecting the second source 22 and second drain 23.

The electric signal applied to the input terminal 66 is converted on the device and matrix shown in FIG. 1A, and is delivered to the output terminal 67. All outputs are determined by the electric signals from the input terminal 66, and therefore one output includes all input information, and therefore the data is holographic (multiplex).

Practically, for example, the character or image may be recognized by the information read in through the image scanner. Such processing is required in order to judge if identical or not, even when the reading position is deviated or the contrast difference is absorbed because the relation of contrast of adjacent pieces of information is important.

Figure 16A:
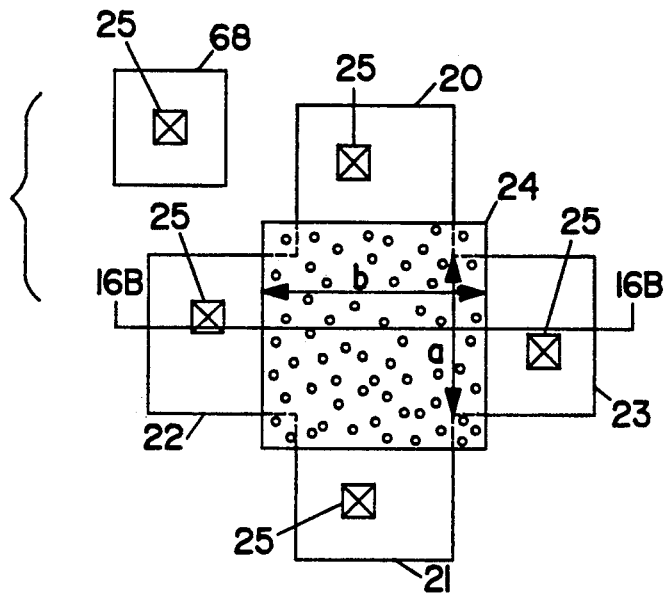
FIG. 16A is a plan view of a semiconductor device according to an eighth embodiment of the invention.
Figure 16B:
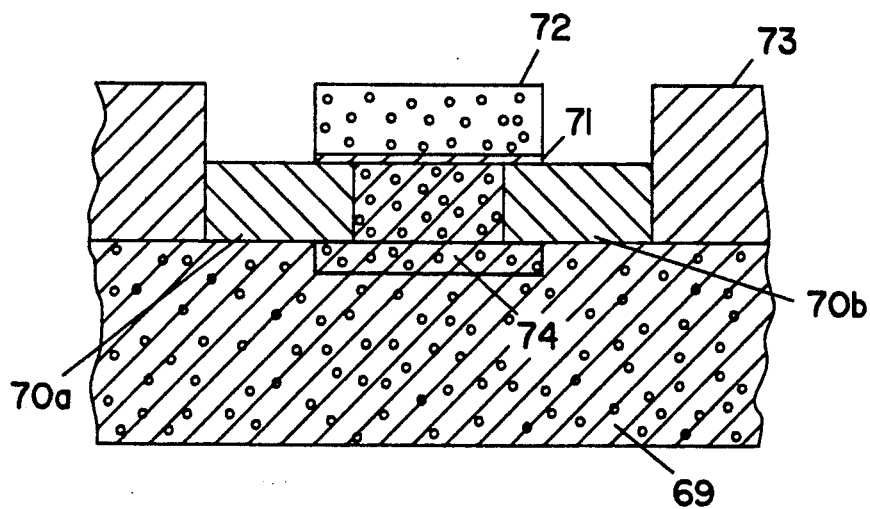
FIG. 16B is a sectional view of 16B—16B in FIG. 16A.
Figure 17A:
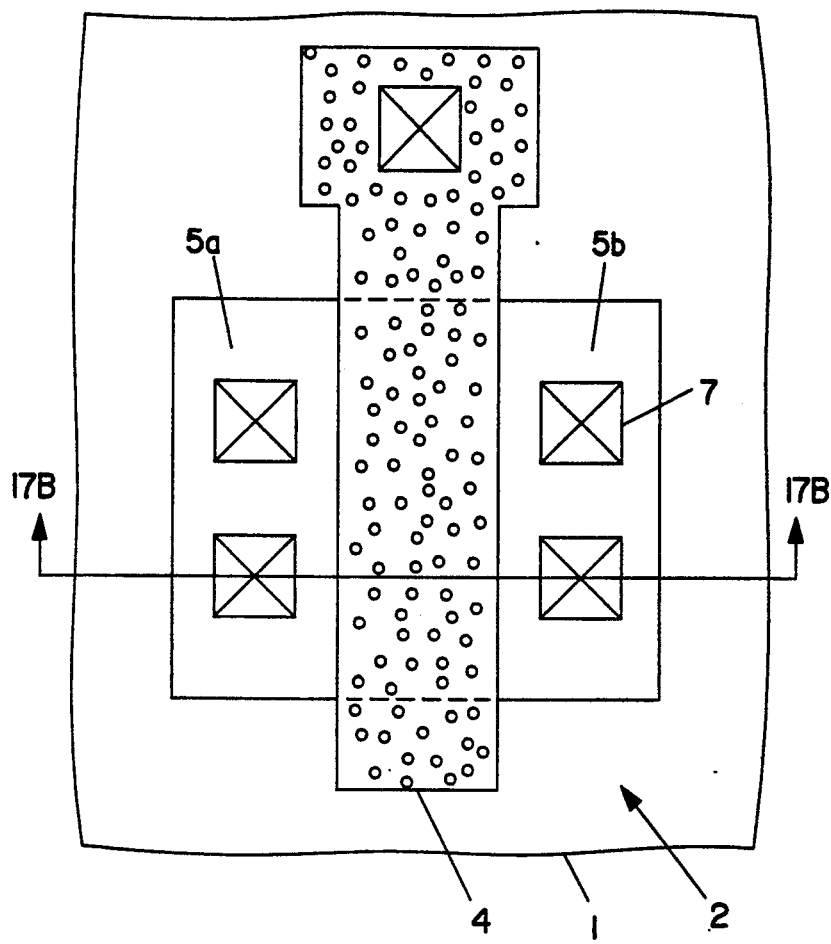
FIG. 17A is a plan view of a conventional semiconductor device.
Figure 17B:
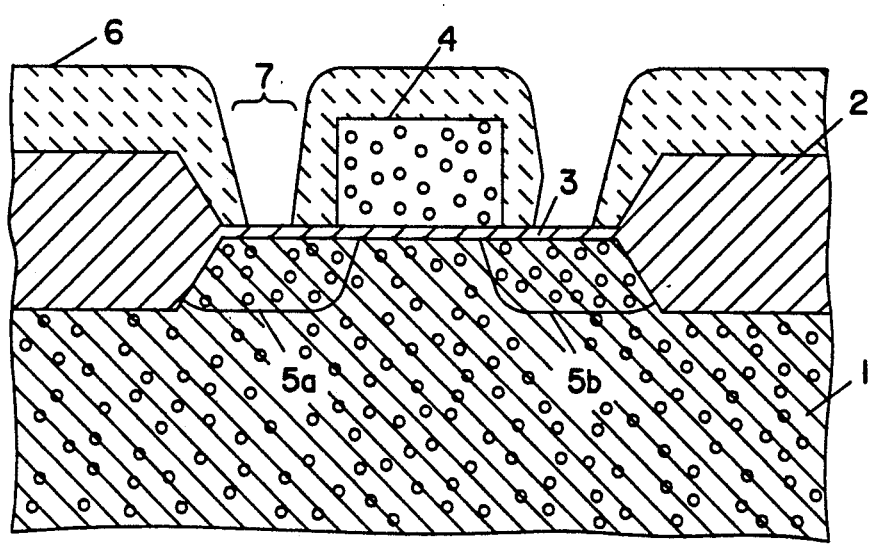
FIG. 17B is a sectional view of 17B—17B in FIG. 17A.

As another embodiment of the invention, a structure of a junction type field effect transistor (JFET) is shown in FIGS. 16A and 16B. FIG. 16A is a plan view of JFET. As far as the plan view is concerned, there is nothing different from the plan view of the device shown in FIG. 1A. In FIG. 1A, the source and drain of the JFET are composed of impurities of the same conductive type. Diffusion layers of a set of first source 20 and first drain 21 and a set of second source 22 and second drain 23 are formed. A common gate 24 is formed in the region of the gate of the diffusion layer of first source 20 and first drain 21 and the gate of the diffusion layer of second source 22 and second drain 23.

To achieve electrical connections of diffusion layers, contact holes 25 are formed in the diffusion layer of first source 20 and first drain 21, and the diffusion layer of second source 22 and second drain 23. A contact hole 25 of the common gate 24 is formed in a region not contacting electrically with the other diffusion layers.

The line linking the first source 20 and first drain 21, and the line linking the second source 22 and second drain 23 are intersecting almost at right angle. There is also a region 68 for applying a substrate voltage.

FIG. 16B is a sectional view of the element in line 16B—16B shown in FIG. 16A during operation of JFET. In FIG. 16B, a diffusion layer 70a to be the second source 22 and a diffusion layer 70b to be a second drain 23 are formed in the silicon substrate 69. A gate oxide film 71 is formed on the silicon substrate 69 on the second source 22 and second drain 23. A gate electrode 72 made of polysilicon is formed on the gate oxide film 71. When a potential over the threshold is applied to the gate electrode 72, the diffusion layer 70a and diffusion layer 70b are connected, and a channel 74 is formed at a deep position inside the substrate immediately beneath the gate. There is also an insulation film 73 for separating the elements in the other region than the element region.

The manner of applying the potential is the same as in the ordinary MOS type transistor. Since nothing is different in the transistor characteristic, the foregoing explanation on the MOS type transistor is entirely applicable to the JFET. That is, the drain current flowing in a specific transistor may be controlled by varying the potential applied to other transistors. Furthermore, having plural pairs of source and drain, by varying the value of the potential applied to each source and drain, the drain current flowing in the transistor may be intentionally increased or decreased. As a result, assuming one of the plurality of sources and drains to be a control terminal of the transistor having another pair of source and drain, by applying an appropriate potential to the control terminal, the intrinsic state of instability of drift in operation of the device may be intentionally created. Besides, the devices of high performance may be formed at high yield, and the optimization of the circuit operation and data collection in designing of circuit may be achieved easily.

According to the invention, as described herein, by employing the conventional transistor manufacturing method, the hitherto impossible device characteristics may be realized. That is, having plural pairs of source and drain, by varying the value of the potential applied to each source and drain, the drain current flowing in the device may be intentionally increased or decreased. As a result, assuming one of the plurality of sources and drains to be a control terminal of the device having another pair of source and drain, by applying an appropriate potential to above-mentioned control terminal, the intrinsic characteristic of the device may be varied, and the state of instability of drift in operation may be intentionally created. Thus, a desired circuit may be composed easily in the circuit design. Furthermore, the hitherto impossible circuit may be composed. In addition, since the electric characteristic of the device may be varied after forming a device or a circuit, it may be possible to cause characteristics of the highest performance. Since the device characteristics can be freely varied, the devices of superb performance may be forced at high yield, and optimization of circuit operation and data collection in circuit design may be achieved easily.

We claim:
1. A semiconductor device comprising:
   (a) a substrate of a first conductivity type having a surface region;
   (b) four non-overlapping diffusion layers including at least a first source layer, a second source layer and a drain layer, disposed in said substrate and electrically separated so that a different voltage level may be applied to each of said diffusion layers, and wherein each of said four diffusion layers is of a second conductivity type which is reverse to said first conductivity type; and
   (c) a common gate disposed on said substrate surface region between said four diffusion layers wherein only one common channel is formed in a single continuous physical region between said four diffusion layers.
2. A semiconductor device of claim 1 further comprising means for causing a current to flow between two of said four diffusion layers.
3. A semiconductor device of claim 1 wherein said means for causing a current to flow is a potential applied to one of said four diffusion layers and said current flows in relation to said applied potential.
4. A semiconductor device of claim 1, wherein two of said four diffusion layers are disposed along a first line and the remaining two diffusion layers of said four diffusion layers is disposed on a second line, said second line being nearly orthogonal to said first line.
5. A semiconductor device of claim 1 wherein two of said four diffusion layers are disposed mutually independently along a straight line, and the remaining diffusion layers of said four diffusion layers is disposed at a position parallel to said straight line.
6. A semiconductor device of claim 1 wherein said common gate includes a width and one of said first source layer and said first drain layer includes a width, and wherein said width of said common gate and said width of said one of said first source layer and said first drain layer are substantially equal.
7. A semiconductor device comprising:
   (a) a substrate of a first conductivity type having a surface region and, disposed in said substrate, a first diffusion layer, a second diffusion layer and a third diffusion layer, said diffusion layers including first and second source layers and a first drain layer, none of said source and drain layers overlapping one another wherein said first source layer and said second source layer are electrically separated so that a first voltage level may be applied to said first source layer and a second voltage level, different from said first voltage level, may be applied to said second source layer and wherein each of said first source layer, said second source layer and said first drain layer is of a second conductivity type which is reverse to said first conductivity type; and
   (b) a common gate disposed on said substrate and located on said substrate between said three diffusion layers wherein only one common channel is formed in a single continuous physical region by said three diffusion layers.
8. A semiconductor device of claim 7 wherein a gate oxide film is disposed under said common gate.
9. A semiconductor device of claim 7 wherein a potential is applied to said third diffusion layer and a current flows between said first and second diffusion layers in relation to said potential applied to said third diffusion layer.
10. A semiconductor device of claim 7 wherein said common gate includes a width and one of said first source region and said first drain region includes a width, and wherein said width of said common gate and said width of said one of said first source region and said first drain layer are substantially equal.
11. A semiconductor device comprising:
   (a) a substrate having a surface region;
   (b) three non-overlapping diffusion layers including a first drain layer, a second drain layer and a source layer, disposed in said substrate and electrically separated so that a different voltage level may be applied to each of said diffusion layers, said semiconductor device including not more than three diffusion layers; and
   (c) a common gate disposed on said substrate surface region between said three diffusion layers wherein only one common channel is formed in a single continuous physical region between said three diffusion layers.
12. A semiconductor device comprising:
   (a) a substrate having a surface region;
   (b) at least five non-overlapping diffusion layers disposed in said substrate and electrically separated; and
   (c) a common gate disposed on said substrate surface region between said diffusion layers wherein only one common channel is formed in a single continuous physical region between said diffusion layers.

* * * * *

UNITED STATES PATENT AND TRADEMARK OFFICE
CERTIFICATE OF CORRECTION

PATENT NO.     : 5,331,192
DATED          : July 19, 1994
INVENTOR(S)    : HITOSHI KUDOH It is certified that error appears in the above-identified patent and that said Letters Patent is hereby corrected as shown below:

Column 15, line 58, claim 3, "claim 1" should read

--claim 2--.

Signed and Sealed this

Twenty-second Day of November, 1994

Attest:

BRUCE LEHMAN

*Attesting Officer*     *Commissioner of Patents and Trademarks*